(12) United States Patent
Jo et al.

(10) Patent No.: US 8,301,986 B2
(45) Date of Patent: Oct. 30, 2012

(54) MEMORY SYSTEM AND METHOD FOR PROVIDING ERROR CORRECTION

(75) Inventors: Nam-Phil Jo, Gyeonggi-do (KR); Dae-Han Youn, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 828 days.

(21) Appl. No.: 12/390,700

(22) Filed: Feb. 23, 2009

(65) Prior Publication Data

US 2009/0217140 A1 Aug. 27, 2009

(30) Foreign Application Priority Data

Feb. 27, 2008 (KR) .................. 200817972

(51) Int. Cl.
  *H03M 13/00* (2006.01)
(52) U.S. Cl. ...................................... 714/785
(58) Field of Classification Search .................. 714/785
  See application file for complete search history.

(56) References Cited

U.S. PATENT DOCUMENTS

| | | | |
|---|---|---|---|
| 4,642,808 A | 2/1987 | Baggen | |
| 4,694,455 A | 9/1987 | Koga | |
| 5,208,815 A * | 5/1993 | Kojima | 714/758 |
| 5,216,676 A * | 6/1993 | Kimura | 714/782 |
| 5,633,882 A * | 5/1997 | Babb et al. | 714/785 |
| 5,948,117 A * | 9/1999 | Weng et al. | 714/784 |
| 6,122,766 A * | 9/2000 | Fukuoka et al. | 714/784 |
| 6,154,869 A * | 11/2000 | Wolf | 714/784 |
| 6,209,115 B1 * | 3/2001 | Truong et al. | 714/784 |
| 6,345,376 B1 * | 2/2002 | Cox et al. | 714/785 |
| 7,716,562 B1 * | 5/2010 | Wu et al. | 714/784 |
| 2001/0056567 A1 * | 12/2001 | Sakurai | 714/805 |
| 2004/0010742 A1 * | 1/2004 | Williamson et al. | 714/746 |
| 2004/0205443 A1 * | 10/2004 | Hoshizawa et al. | 714/785 |
| 2006/0136800 A1 * | 6/2006 | Kawabata et al. | 714/763 |
| 2006/0174182 A1 * | 8/2006 | Neefs et al. | 714/785 |
| 2006/0282751 A1 * | 12/2006 | Passint | 714/785 |
| 2007/0033507 A1 * | 2/2007 | Jiang | 714/785 |
| 2008/0052564 A1 * | 2/2008 | Yim et al. | 714/699 |
| 2008/0148129 A1 * | 6/2008 | Moon et al. | 714/758 |
| 2008/0163033 A1 * | 7/2008 | Yim | 714/785 |

FOREIGN PATENT DOCUMENTS

KR    10-0310671    9/2001

* cited by examiner

*Primary Examiner* — Joshua Lohn
(74) *Attorney, Agent, or Firm* — Volentine & Whitt, PLLC

(57) ABSTRACT

An error correction decoder includes a syndrome computation circuit, an error correction and computation circuit and an error correction circuit. The syndrome computation circuit calculates a syndrome of read data. The error correction and computation circuit calculates a location of a single-bit error using a division operation between elements of the syndrome when the single-bit error exists in the read data. The error correction circuit corrects the single-bit error of the read data based on the location of the single-bit error.

20 Claims, 12 Drawing Sheets

MEMORY SYSTEM AND METHOD FOR PROVIDING ERROR CORRECTION

PRIORITY STATEMENT

A claim of priority is made to Korean Patent Application No. 10-2008-0017972, filed on Feb. 27, 2008, in the Korean Intellectual Property Office, the subject matter of which is hereby incorporated by reference.

SUMMARY

Embodiments of the present invention relate to a semiconductor memory device. More particularly, the present invention relates to a memory system and method capable of reducing read error of a non-volatile memory device.

Semiconductor memory devices are generally classified as non-volatile semiconductor memory devices or volatile semiconductor memory devices. Volatile semiconductor memory devices perform read and write operations at high speed, but stored contents disappear when powered off. Non-volatile semiconductor memory devices retain stored contents, even when powered off. Therefore, the non-volatile semiconductor memory devices may be used to securely store contents, even during a sudden loss of power. The non-volatile semiconductor memory devices include mask read-only memory (MROM), programmable read-only memory (PROM), erasable programmable read-only memory (EPROM), electrically erasable programmable read-only memory (EEPROM), and the like.

Some non-volatile memories, such as MROM, PROM, and EPROM, are not free to be erased and written to by the system itself, so it is not easy for general users to update stored contents. However, EEPROM is capable of being electrically erased or written. Application of EEPROM includes auxiliary memories and system programming, where continuous updates are needed (e.g., using flash EEPROM). In particular, flash EEPROM (hereinafter, referred to as flash memory) is more highly integrated than conventional EEPROM, and thus is well suited for large auxiliary memory applications. NAND flash memory has a higher degree of integration than other types of flash memories.

Generalized multi-bit memory devices capable of storing multi-bit data per cell have been developed in response to demand for higher integration. In a multi-bit flash memory device, gaps between threshold voltage distributions of memory cells may be controlled densely. Dense control of threshold voltage distributions requires fine control operations, which increase time and lower program speed. Thus, in general, a multi-bit flash memory device may control a read operation to realize maximum performance with a limited source. A memory controller may interface a host and the flash memory device, and correct errors in data read out from the flash memory device during the read operation.

An error correction code (ECC) circuit or an error correction decoder in the memory controller may detect and correct errors in the read data. Error probability increases in proportion to the number of data bits stored in a memory. Thus, a high performance ECC circuit may require further high integration, since correcting errors in read data may require a relatively long time.

Embodiments of the present invention are directed to a memory system and error correction method capable of reducing or minimizing latency of an error correcting operation to provide error-corrected read data in a high speed.

One aspect of the present invention provides an error correction decoder that includes a syndrome computation circuit, an error correction and computation circuit and an error correction circuit. The syndrome computation circuit calculates a syndrome of read data. The error correction and computation circuit calculates a location of a single-bit error using a division operation between elements of the syndrome when the single-bit error exists in the read data. The error correction circuit corrects the single-bit error of the read data based on the location of the single-bit error.

Another aspect of the present invention provides a method of correcting an error of circuit code data. The method includes computing a syndrome of read data; determining when the read data includes an error and whether the error of the read data is a one-bit error, based on the syndrome; when the error of the read data is a one-bit error, obtaining an error location using a division operation of consecutive elements of the syndrome; and correcting the error of the read data based upon the error location.

Another aspect of the present invention provides a memory system which includes a non-volatile memory device and a memory controller. The memory controller includes an error correction code (ECC) circuit for eliminating an error from read data of the non-volatile memory device. The ECC circuit includes a syndrome computation circuit an error correction and computation circuit and an error correction circuit. The syndrome computation circuit computes a syndrome from the read data. The error correction and computation circuit computes a location of the error of the read data using a division operation between elements of the syndrome when the error is a single-bit error. The error correction circuit corrects the error of the read data with reference to the error location.

BRIEF DESCRIPTION OF THE DRAWINGS

Embodiments of the present invention will be described with reference to the attached drawings, wherein like reference numerals refer to like parts throughout the various figures unless otherwise specified, in which.

DETAILED DESCRIPTION OF THE EMBODIMENTS

Figure 1:
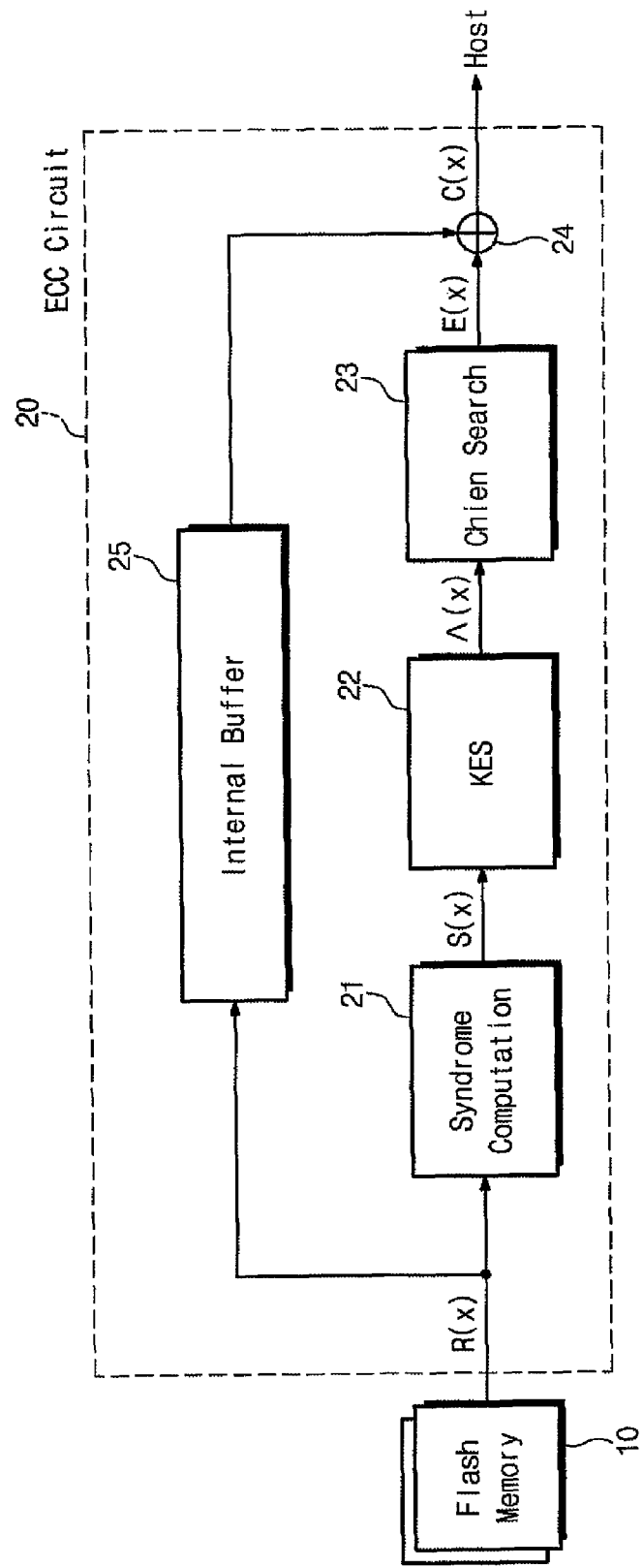
FIG. 1 is a schematic circuit diagram showing an error correction circuit.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements. Also, syndrome values used to describe an error correction operation may be marked alphabetically indicating vectors.

FIG. 1 is a circuit diagram showing a memory system for detecting and correcting an error of read data R(x). Referring to FIG. 1, data R(x) read out from flash memory device 10 is transferred to ECC circuit 20. The ECC circuit 20 includes an internal buffer 25 that temporarily stores the read data R(x). The ECC circuit 20 further includes a syndrome computation circuit 21, a key equation solver (KES) 22, and a Chien search circuit 23, which are configured to generate an error correction vector E(x) from the read data R(x).

The syndrome computation circuit 21 calculates syndrome S(x) in response to the read data R(x). Whether the read data R(x) includes an error may be determined based on the syndrome S(x). That is, the syndrome S(x) may indicate error information with respect to the read data R(x). The syndrome S(x) calculated by the syndrome computation circuit 21 is transferred to the KES circuit 22. The KES circuit 22 obtains an error location polynomial and an error pattern polynomial from the syndrome S(x), and outputs error location polynomial Λ(x).

The Chien search circuit 23 calculates a root of the error location polynomial Λ(x), e.g., with reference to the error location polynomial and the error pattern polynomial. The Chien search circuit 23 may further calculate an error size corresponding to each error location searched via the error location polynomial Λ(x). The Chien search circuit 23 may seek error location and size of the read data R(x) using Chien search algorithm, and output the error correction vector E(x) for correcting the errors.

Internal buffer 25 may be a buffer memory that stores the read data R(x), and may function in a first-in first-out (FIFO) manner. Error correction circuit 24 may correct an error in the read data R(x) by multiplying the read data R(x) in the internal buffer 25 by the error correction vector E(x) calculated by the Chien search circuit 23. The error-corrected read data C(x) may be transferred to a host.

Examples of the ECC circuit 20 are disclosed in U.S. Pat. No. 4,694,455 to KOGA (Sep. 15, 1987) and U.S. Pat. No. 6,209,115 to TRUONG et al. (Mar. 27, 2001), the contents of which are hereby incorporated by reference.

However, data read from the memory system of FIG. 1 include a buffering path of the internal buffer 25 and an error correction path for detecting and correcting an error. Latency generated when transferring read data may be determined by latency generated on the error correction path.

Figure 2:
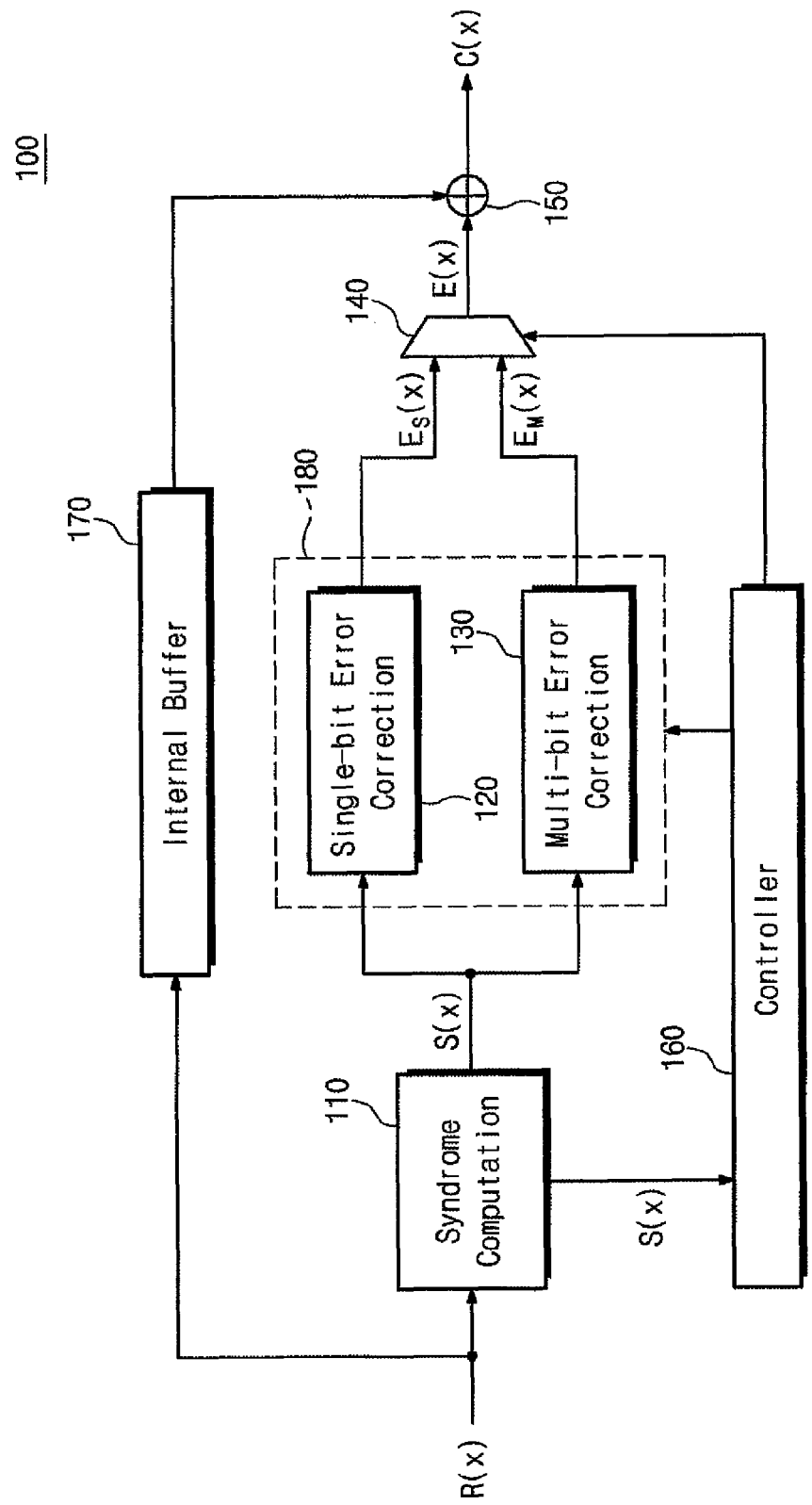
FIG. 2 is a block diagram showing an error correction circuit, according to exemplary embodiments of the present invention.

FIG. 2 is a circuit diagram showing an error correction circuit, according to exemplary embodiments of the present invention. Referring to FIG. 2, ECC circuit or error correction decoder 100 is capable of increasing error correction efficiency by applying different error correction algorithms according to an error bit number. That is, the error correction decoder 100 may use different error correction methods with respect to a one-bit error (or, a single-bit error) and a multi-bit error (i.e., two or more error bits). With this error correction scheme, an error of read data R(x) is corrected at a high speed, and error-corrected read data is transferred to a host.

Data R(x) is read out from a flash memory device (not shown) and stored in internal buffer 170 during a time when an error is being detected and corrected. The internal buffer 170 may store and output the read data R(x) in a first-in first-out (FIFO) fashion, for example. The error correction decoder 100 generates an error correction vector E(x). In order to generate the error correction vector E(x), the read data R(x) is transferred to a syndrome calculator or syndrome computation circuit 110, which produces a syndrome S(x) providing error information. For example, the syndrome S(x) may be calculated by multiplying the read data R(x) by a parity detection polynomial H(x). The parity detection polynomial H(x) may be determined by applying a root of a generation polynomial G(x).

The syndrome S(x) may include all information used to detect and correct an error in the read data R(x). Accordingly, it is possible to detect whether the read data R(x) has an error using the syndrome S(x). For example, the syndrome S(x) may include error location, pattern and size information. Thus, the syndrome S(x) may be used to detect error bits, judge error correction probability, and perform an error correction operation with respect to the read data R(x). The syndrome computation circuit 110 may compute and output a syndrome S(x) with respect to a code word corresponding to the read data R(x).

The error correction decoder 100 error includes a correction and computation circuit 180, including a single-bit error correction circuit 120 and a multi-bit error correction circuit 130. An operation for error correction with reference to the syndrome S(x) may be performed by the single-bit error correction circuit 120 and/or the multi-bit error correction circuit 130, depending on the number of error bits. The single-bit error correction circuit 120 is activated when the read data R(x) has a one-bit error. The one-bit error can be corrected by only seeking the location of the one-bit error. Thus, the one-bit error is able to be corrected using a relatively simple error correction operation. The single-bit error correction circuit 120 generates an error correction vector $E_S(x)$ for correcting the one-bit error.

The multi-bit error correction circuit 130 is activated when two or more error bits are detected in the read data R(x). The multi-bit error correction circuit 130 seeks an error location polynomial and an error pattern polynomial with respect to a multi-bit error. The multi-bit error correction circuit 130 outputs an error correction vector $E_M(X)$ for correcting an error in the read data R(x) with reference to the error location and pattern polynomials.

Multiplexer 140 selects one of the error correction vectors $E_S(x)$ and $E_M(x)$ under control of controller 160 as the selected error correction vector E(x). The selected error correction vector E(x) is provided to error correction circuit 150, where the error correction vector E(x) is added to the read data R(x) stored in the internal buffer 170.

The controller 160 also initially receives the syndrome S(x) from the syndrome computation circuit 110 and judges whether the read data R(x) is erroneous. When the read data R(x) is erroneous, the controller 160 may detect whether an error of the read data R(x) is a single-bit error or a multi-bit error. In case of a circuit code, such as a Bose Chaudhuri Hocquenghem (BCH) code or a Read-Solomon (RS) code, when elements of the syndrome value S(x) satisfy Equation 1, below, the error of the read data R(x) may be judged to be the one-bit error.

$$(S_1)^3 = S_3 \text{(where } S_1 \text{ does not equal zero)}. \quad \text{[EQUATION 1]}$$

In other words, the controller 160 may determine the error of the read data R(x) to be a one-bit error when the elements of the syndrome S(x) provided from the syndrome computation circuit 110 satisfy the condition of the Equation 1. Then, the controller 160 may activate the single-bit error correction circuit 120 to determine an error location. When the error location is determined, the control circuit 160 controls the multiplexer 140 to output the error correction vector $E_S(x)$ as the error correction vector E(x) to eliminate the one-bit error.

With the above-described structure, when a one-bit error is detected, the error correction decoder 100 may skip KES and Chien search operations, and directly compute an error location via a division operation between syndrome elements, for example. That is, location and pattern information of a one-bit error may be obtained by a division operation $S_{i+1}/S_i$ of syndrome elements. This error operation may be embodied, for example, by simple operation means or an algorithm. Thus, when a one-bit error is detected, the error correction decoder 100 performs an error correction operation at high speed, so that latency is reduced or minimized.

Figure 3:
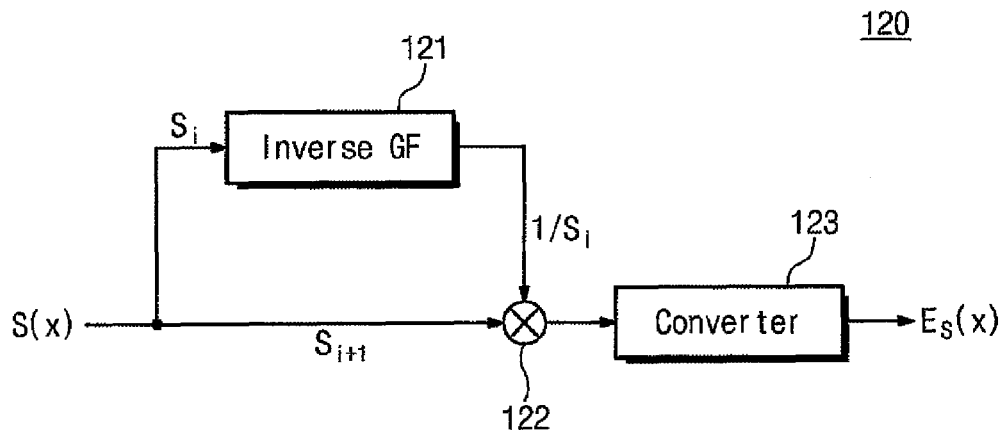
FIG. 3 is a block diagram showing a single-bit error correction circuit, according to exemplary embodiments of the present invention.

FIG. 3 is a block diagram showing a single-bit error correction circuit of FIG. 2, according to an exemplary embodiment of the present invention. Single-bit error correction circuit 120 may be activated when it is detected that the read data R(x) has a one-bit error. Referring to FIG. 3, the single-bit error correction circuit 120 may generate an error correction vector $E_S(x)$ from syndrome S(x), which is used to correct a one-bit error, without executing a KES algorithm or performing a Chien search operation. That is, the single-bit error correction circuit 120 determines an error location using only values of syndrome elements, without generating error location and error pattern polynomials, and using its quotient. Since the KES and Chien operations are skipped, thus removing most latency in the error correction operation, the speed of a one-bit error correction operation and the read speed of the read data R(x) increase.

More specifically, the single-bit error correction circuit 120 may include an inverse Galois-Field module 121 as a function circuit, which calculates a reciprocal $1/S_i$ of calculated syndrome element $S_i$. For example, the inverse Galois-Field module 121 may include a look-up table of figures corresponding to numbers of elements in the Galois-Field. The inverse Galois-Field module 121 is thus able to use a high-speed operator in order to compute the reciprocal $1/S_i$ of the syndrome element $S_i$ at high speed. For example, when an error correction encoder encodes data by 512-byte units, parity bits for error detection and correction are added to the data. The inverse Galois-Field module 121 thus requires a Galois-Field having $2^{13}$ bits (512*2*$2^3$), or 8192 elements. Accordingly, for syndrome element $S_i$ having a 13-bit length, the inverse Galois-Field module 121 has previously calculated 8192 ($2^{13}$) inverse fields. The reciprocal $1/S_i$ corresponding to the syndrome element $S_i$ may then be searched in look-up table fashion.

Calculation of $S_{i+1}/S_i$ must be conducted to detect an error location using only a syndrome. Therefore, in the depicted representative embodiment, a Galois-Field multiplier 122 multiplies the reciprocal $1/S_i$ and syndrome element $S_{i+1}$, thus avoiding a complicated division operation. The value of $S_{i+1}/S_i$ from the Galois-Field multiplier 122 is sent to a converter 123. When there is a one-bit error, an error location value is expressed by Equation 2, below, using only syndrome elements:

$$\frac{S_1}{S_0} = \frac{S_2}{S_1} = \ldots = \frac{S_{i+1}}{S_i} = \alpha^j \quad \text{[EQUATION 2]}$$

In Equation 2, syndrome element $S_i$ does not equal zero, j is an error location, and α is a real zero of an original polynomial.

The converter 123 converts the $S_{i+1}/S_i$ value into error location L(x) and error pattern P(x), as would be generated at a Chien search circuit. The converted error patterns may be provided as an error correction vector $E_S(x)$ for eliminating a one-bit error of the read data R(x) in the error correction decoder 100.

The division operation of the syndrome elements performed in the single-bit error correction circuit 120 may be performed in a look-up table fashion, as discussed above, for example. That is, the inverse Galois-Field module 121 may store reciprocals of syndrome elements Si and perform a division operation by multiplication using the appropriate stored values. Since the role of a divider, which is a complicated hardware component, is conducted using a table (e.g., ROM table) and a multiplier, a high speed error correction operation may be supported.

Figure 4:
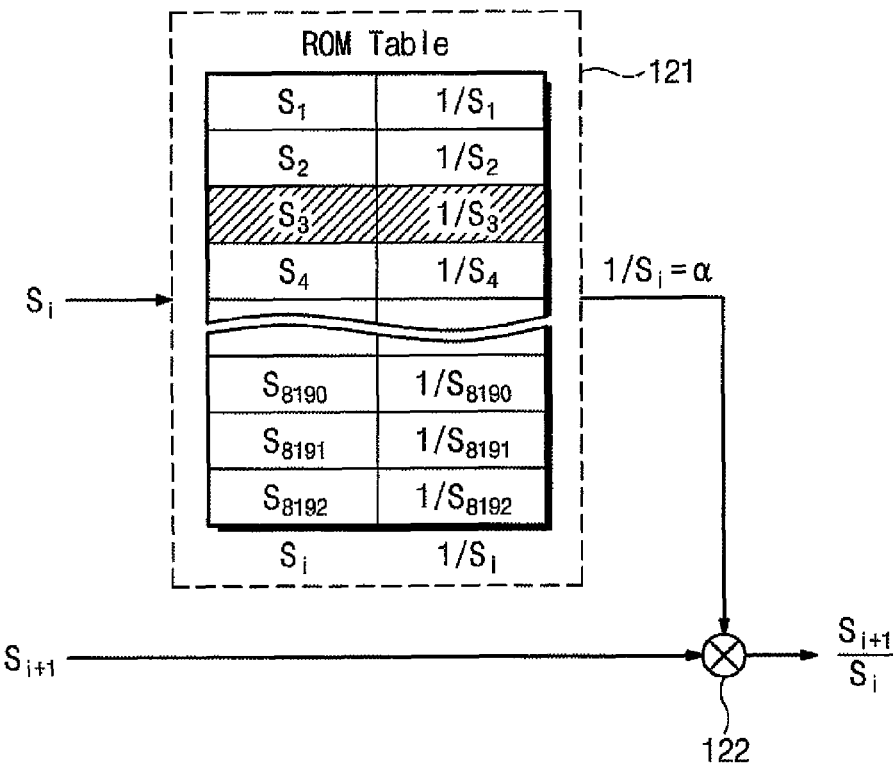
FIG. 4 is a block diagram showing a look-up table of the single-bit error correction circuit in FIG. 3, according to an exemplary embodiment of the present invention.

FIG. 4 is a block diagram showing a single-bit error correction circuit of FIG. 3, according to an exemplary embodiment of the present invention. Referring to FIG. 4, the inverse Galois-Field module 121 may be implemented by hardware included in a memory controller (not shown) for interfacing a flash memory device and a host. That is, a ROM table stores reciprocals of all elements of a syndrome and outputs a reciprocal of input syndrome $S_i$, through a look-up operation, more fully described below.

When calculated syndrome elements $S_i$ are transferred from a syndrome computation circuit (e.g., syndrome computation circuit 110 in FIG. 2), a reciprocal $1/S_i$ corresponding to $i^{th}$ syndrome element $S_i$ is selected in the ROM table in the inverse Galois-Field module 121. The ROM table may store all field values (e.g., 8192=$2^{13}$) of syndrome elements and corresponding reciprocals. For example, when syndrome $S_3$ is input, the ROM table is controlled such that corresponding reciprocal $1/S_3$ is output.

In an embodiment, a representative driving algorithm, below, of the inverse Galois-Field module 121, provides reciprocals using the above-described ROM table, for example:

```
always @(Si) begin
    case(Si) // synopsys parallel_case full_case
        13'b0000000000000: result = 13'b0000000000000;
        13'b0000000000001: result = 13'b0000000000001;
        13'b0000000000010: result = 13'b1000000001101;
```

```
    13'b0000000000011: result = 13'b1111111110110;
        .
        .
        .
    13'b1111111111110: result = 13'b100100010101;
    13'b1111111111111: result = 13'b1011101000001;
      endcase
    end
```

According to the above-described algorithm, reciprocals $1/S_i$ corresponding to multiple syndrome elements $S_i$ are stored in the ROM table. Thus, results are appointed to output a corresponding reciprocal using sentence 'case( )'.

Figure 5:
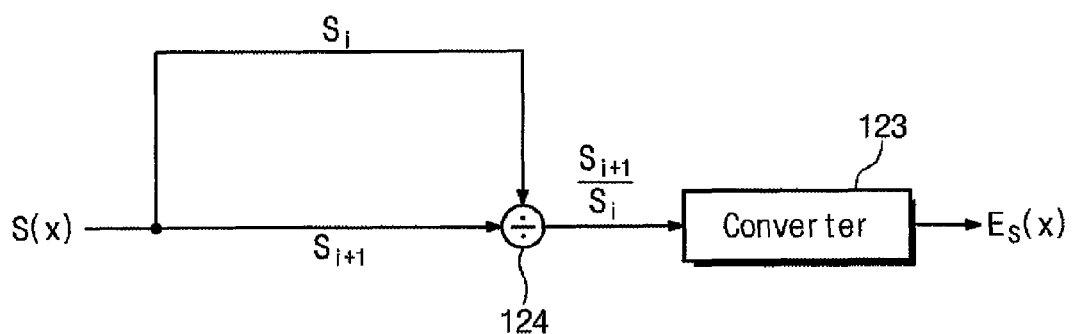
FIG. 5 is block diagram showing a single-bit error correction circuit, according to an exemplary embodiment of the present invention.

FIG. 5 is a block diagram showing a single-bit error correction circuit of FIG. 2, according to another exemplary embodiment of the present invention. Single-bit error correction circuit 120 is activated when it is detected that read data R(x) has a one-bit error. Referring to FIG. 5, the single-bit error correction circuit 120 may produce an error correction vector $E_S(x)$ for correcting a one-bit error from a syndrome, without performing KES or Chien search operations. In other words, the single-bit error correction circuit 120 computes error location and pattern using only the syndrome.

More particularly, referring to FIG. 5, the operation of syndrome elements $S_{i+1}/S_i$ is conducted by a division operation. That is, the single-bit error correction circuit 120 conducts the division operation of $S_{i+1}/S_i$ using divider 124. The divider 124 performs the division operation using syndrome element $S_i$ as the divisor and consecutive syndrome element $S_{i+1}$ as the dividend. The resulting value of the division operation of $S_{i+1}/S_i$ may then be transferred to converter 123 to be converted into a general format for error correction vector $E_S(x)$ indicating error location L(x) and error pattern P(x).

Figure 6:
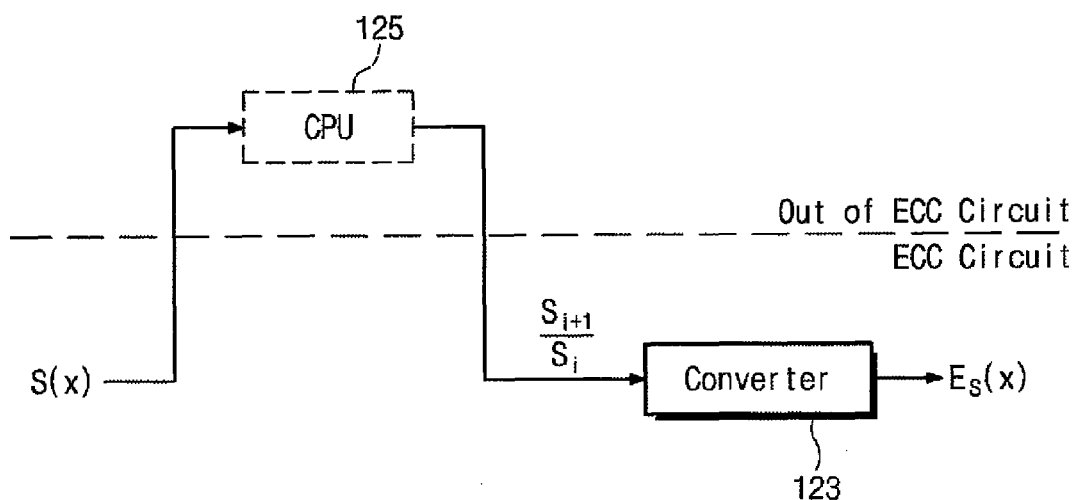
FIG. 6 is a block diagram showing a single-bit error correction circuit, according to an exemplary embodiment of the present invention.

FIG. 6 is a block diagram showing a single-bit error correction circuit of FIG. 2, according to another exemplary embodiment of the present invention. Referring to FIG. 6, it is possible to minimize the load of an error correction circuit and to distribute a resource. Where there is a correctable error indicated by syndrome S(x) input from syndrome computation circuit 110, and the correctable error is determined to be a single-bit error, the syndrome S(x) may be sent to a central processing unit (CPU) 125 in response to an interrupt. In alternative embodiments, the CPU 125 may be located outside (as shown) or inside the error correction decoder 100. Also, in an embodiment, the CPU 125 may perform a division operation of $S_{i+1}/S_i$ with respect to elements of the received syndrome S(x), for example, according to the following algorithm:

```
    g_num[0] = 0, j = 1;
    for(i=1; i<2^13; i++) {
      g_num[i] = j;
      if(j & 0x1000) {
        j <<= 1;
        j ^= 0x001b;
      } else {
        j <<= 1;
      }
      j &= 0x1fff;
    }
    for(i=0; i<2^13; i++) {
      for(j=0; j<2^13; j++) {
        if(i==g_num[j]) {
          if(j==0) inv = 0;
          else if(j==8191) inv = 2^13 -1;
          else      inv = 2^13 -j -1;
```
```
        }
      }
    }
```

When the above algorithm is completed, the CPU 125 temporarily stores the result, which is returned to the single-bit error correction circuit 120 as a value indicative of error location. The $S_{i+1}/S_i$ result indicating the error location is sent to converter 123 to be converted into a general format for error correction vector $E_S(x)$ indicating error location L(x) and error pattern P(x).

Exemplary operation methods and devices have been described for directly computing a location of a one-bit error via a division operation of a syndrome. However, as would be apparent to one of ordinary skill in the art, the embodiments of the single-bit error correction circuit 120 are not limited to this disclosure.

Figure 7:
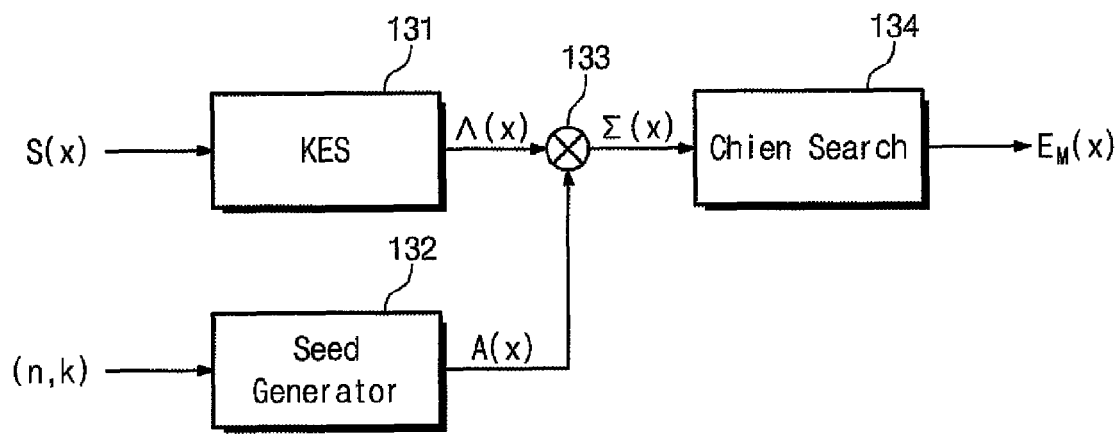
FIG. 7 is a block diagram showing a multi-bit error correction circuit, according to an exemplary embodiment of the present invention.

FIG. 7 is a block diagram showing a multi-bit error correction circuit of FIG. 2, according to an exemplary embodiment of the present invention.

As illustrated in FIG. 7, a multi-bit error correction circuit 130 includes a KES circuit 131, a seed generator 132 and a Chien search circuit 134. In an embodiment, the multi-bit error correction circuit 130 may be configured to perform a forward Chien search operation (via the Chien search circuit 134) and to simultaneously output error-corrected data. That is, in case of a backward Chien search scheme, read data is output only after the Chien search operation is completed. On the other hand, in case of the forward Chien search operation, although a Chien search operation is not completed with respect to one code word in accordance with a seed value A(x) provided from the seed generator 132, error correction vector data searched via the Chien search operation may be output in a pipeline manner.

The KES circuit 131 computes an error location polynomial and an error pattern polynomial from a syndrome S(x), and outputs error location polynomial Λ(x). When decoding in a Reed-Solomon (RS) manner, for example, the KES circuit 131 may be realized using Euclidean algorithm (EA), modified Euclidean (ME) algorithm, or Berlecamp-Massay (BM) algorithm. Further, division-free ME and fast ME structures may be included in the KES circuit 131.

The seed generator 132 previously provides the seed value A(x) for the Chien search circuit 134 to perform the forward Chien search operation at an operation where zeros of the error location polynomials and error pattern polynomials are obtained. For the forward Chien search operation, the seed generator 132 may be configured to provide an initial seed value corresponding to length information (n, k) of a code word, that is, read data R(x).

The multi-bit error correction circuit 130 also includes a Galois-Field multiplier 133, for example, which generates a new error location polynomial Σ(x) by multiplying the error location polynomial Λ(x) output from the KES circuit 131 and the seed value A(x) output from the seed generator 132.

The Chien search circuit 134 may execute a forward Chien search operation with reference to the new error location polynomial Σ(x). An error correction vector $E_M(x)$, generated according to the forward Chien search operation, may be output at the same time the Chien search operation is being performed. As discussed above, unlike a backward Chien search operation, where an error correction vector is output only after the Chien search operation has been completed, during the forward Chien search operation, correction and output for an error of read data may be conducted at the same time as the Chien search operation. Thus, it is possible to reduce latency incurred performing the Chien search operation. When error location and size of read data are calculated according to the forward Chien search algorithm of the Chien search circuit 134, the result is output as error correction vector $E_M(x)$ for correcting such an error.

Error correction operations of single-bit and multi-bit error correction circuits 120 and 130 are described with reference to FIGS. 3 to 7. When detection of an error and an error bit number is completed using syndrome S(x), controller 160 (refer to FIG. 2) selectively activates one of the single-bit and multi-bit error correction circuits 120 and 130. The controller 160 causes multiplexer 140 to output a calculated result of the selected circuit as an error correction vector E(x). The output error correction vector E(x) may be added with read data R(x) stored in an internal buffer 170, for example, in a FIFO fashion. It is possible to correct a one-bit error or a multi-bit error of the read data R(x) by performing an addition operation, for example, in a modular-2 addition manner, at error correction circuit 150. Error-corrected read data C(x) may be transferred to a host (not shown).

Figure 8:
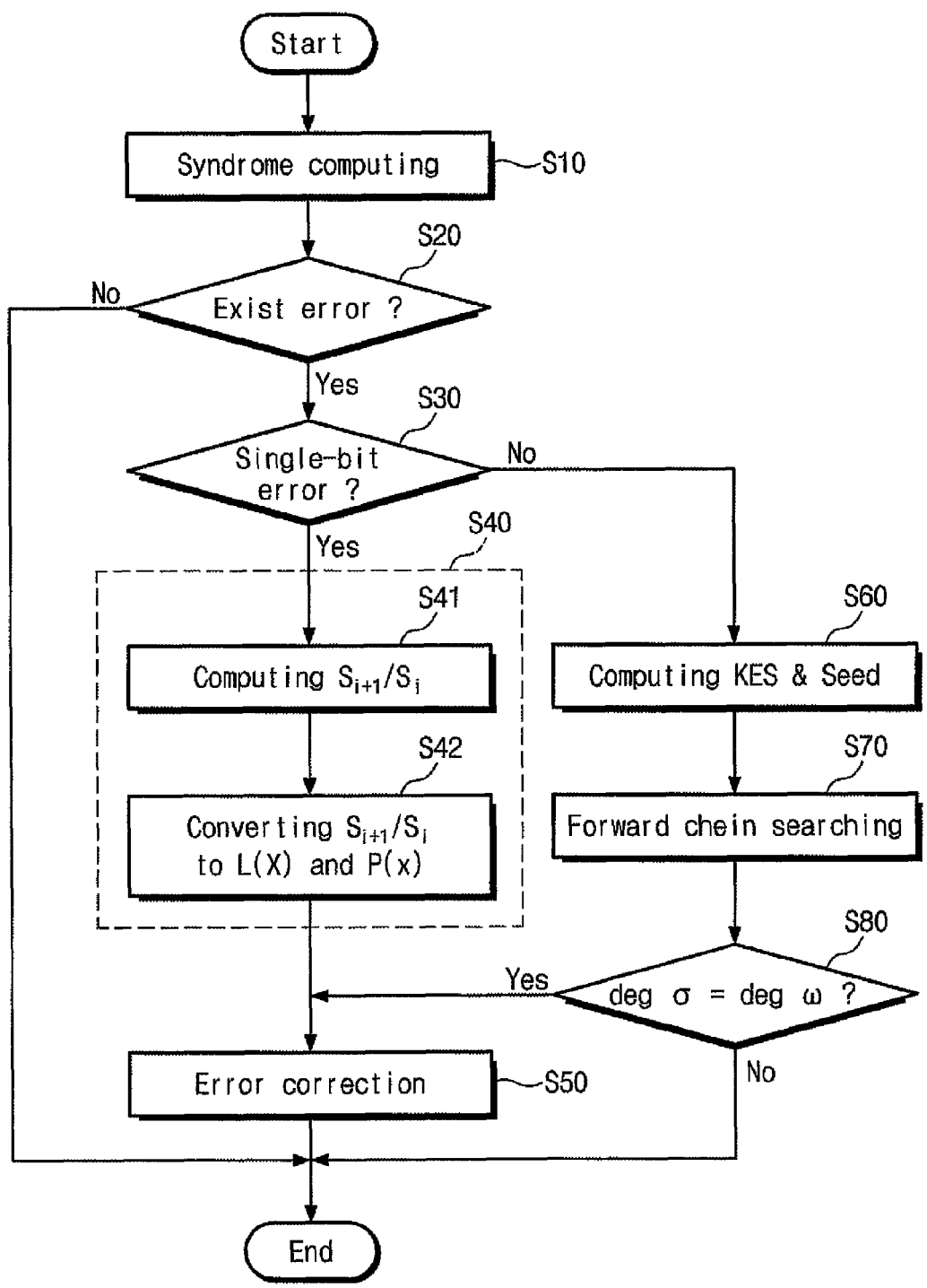
FIG. 8 is a flow chart showing an error correction operation, according to exemplary embodiments of the present invention.

FIG. 8 is a flow chart showing a representative error correction operation of the error correction decoder 100, according to an exemplary embodiment of the present invention. Referring to FIG. 8, in case of a single-bit error, an error correction circuit calculates an error location using division operation $S_{i+1}/S_i$ of consecutive syndrome elements and corrects the single-bit error. In case of a multi-bit error, the error correction circuit computes error location and error pattern according to a forward Chien search operation. Thus, when most errors of a memory system are one-bit errors, it is possible to reduce latency of the read operation. Below, an error correction method according to an illustrative embodiment of the present invention will be described more fully with reference to constituent elements of FIG. 2.

When read data R(x) is transferred, operations for detecting and correcting associated errors commence. When error correction decoder 100 begins to receive the read data R(x), a syndrome S(x) is computed with respect to the read data R(x) in step S10. Control circuit 160 judges whether the read data R(x) is erroneous, based on the syndrome S(x) generated by syndrome computation circuit 110 in step S20. For example, when all syndrome element values of the syndrome S(x) are "0," it is determined that no errors have been detected. Otherwise, the read data R(x) is erroneous. When no error exists, the error correction operation of the error correction decoder 100 ends.

However, when syndrome element values of the syndrome S(x) are not a zero, the controller 160 judges whether an error of the read data R(x) is a one-bit error or a multi-bit error, based on the syndrome elements of the syndrome S(x), beginning in step S30. That is, the controller 160 checks and determines whether the syndrome S(x) indicates a single-bit error, for example, when the syndrome elements of the syndrome S(x) satisfy Equation 1, discussed above. When a single-bit error is detected, the process proceeds to step S40, in which an error location is calculated based only on the syndrome S(x). However, when the syndrome S(x) indicates that two or more erroneous data bits exist, the process proceeds to steps S60 and S70, in which error location and error pattern are obtained by computing KES and performing a forward Chien search operation.

Returning to step S40, when the syndrome S(x) indicates that the read data R(x) includes a one-bit error, a division operation between syndrome elements $S_{i+1}/S_i$ is performed in step S41 with respect to sequential syndrome elements $S_{i+1}$ and $S_i$ of the calculated syndrome S(x). A representative method for performing the syndrome element computation $S_{i+1}/S_i$ is described with reference to FIG. 4, above, in which a ROM table stores reciprocals corresponding to syndrome elements to be used. Step S41 may perform a division operation in software, for example, and return the result to an error correction circuit, e.g., according to a divider and/or hardware interrupt. In step S42, converter 123 converts the division result into error location and error pattern information (L(x), P(x)), which may be used for correcting the single-bit error correction at step S50.

When the syndrome S(x) indicates that the read data R(x) includes a multi-bit error, an error correction operation commences using a forward Chien search operation. More particularly, KES circuit 131 performs a KES operation in step S60 to obtain error location and error pattern polynomials for the forward Chien search operation. Also in step S60, a seed value may be calculated and selected with reference to code length information (n, k). In step S70, Chien search circuit 134 performs a forward Chien search operation, in which results may be output during the search operation in a pipeline manner, based on the seed value and error location and error pattern polynomials. The forward Chien search operation is repeated until it is determined in step S80 that degree σ of the error location polynomial and degree ω of the error pattern polynomial become identical, which indicates that the error is correctable. In this case, the error correction decoder 100 provides an error correction vector $E_S(x)$ to correct an error in step S50. Otherwise, when the degree σ of the error location polynomial is different from the degree ω of the error pattern polynomial, the error is uncorrectable. In this case, the error correction operation for the read data R(x) is ends.

With the above-described operation, embodiments of the present invention are capable of seeking an error pattern and correcting a single-bit error using only a syndrome. Further, when a multi-bit error is detected, a seed is generated with reference to code length information (n, k), so that a forward Chien search operation may be performed. Thus, it is possible to support a speedy error correction function.

Figure 9:
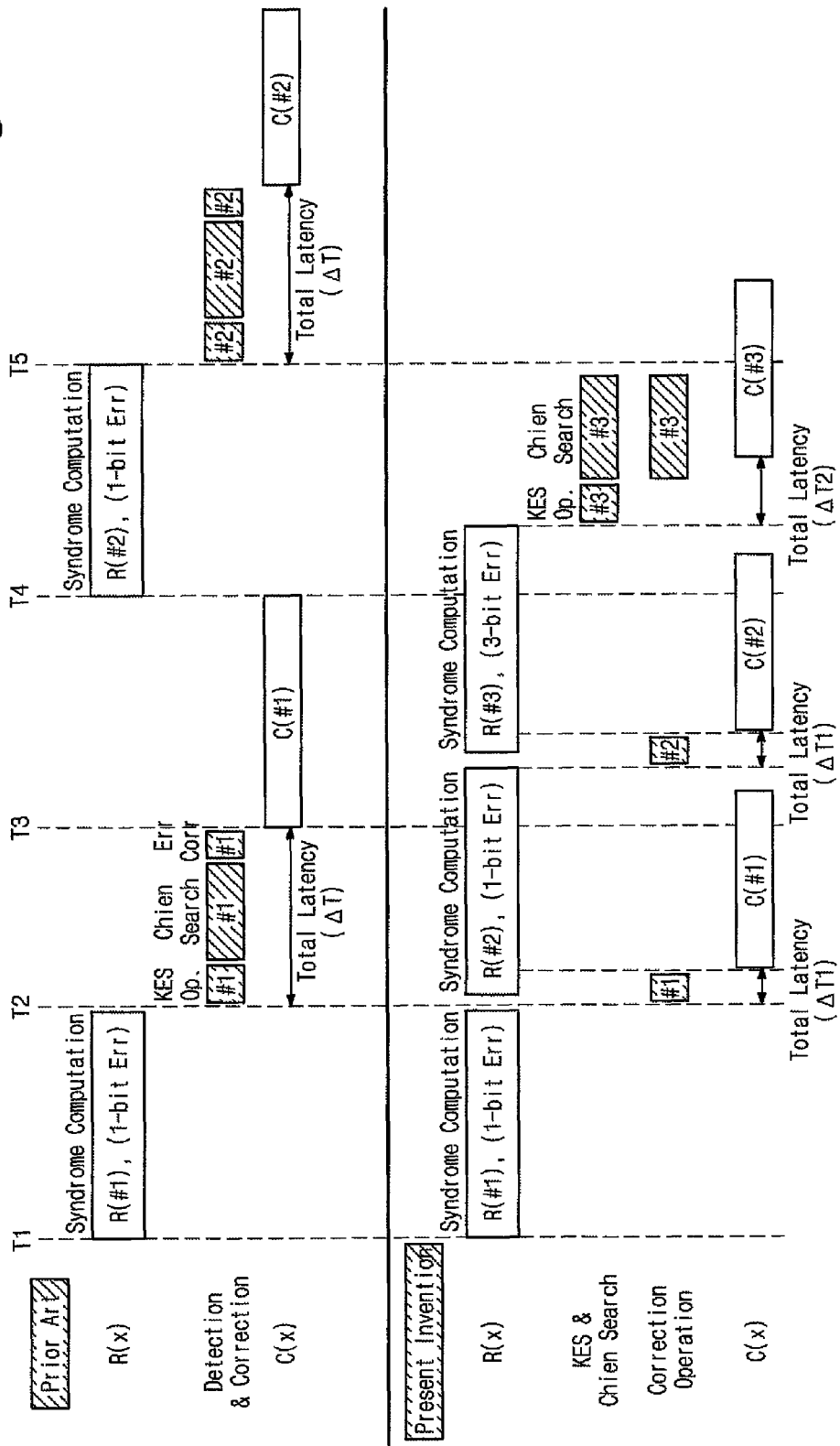
FIG. 9 is a timing diagram showing an error correction operation, according to exemplary embodiments of the present invention.

FIG. 9 is a timing diagram showing an error correction operation, according to exemplary embodiments of the present invention. FIG. 9 shows timing of a prior art error correction operation, in which KES and Chien search operations are performed for a one-bit error, and timing of an error correction operation according to embodiments of the present invention, in which an error pattern is obtained using only on a syndrome. In FIG. 9, latencies of internal operations are illustrated with respect to read data R(#1) and R(#2), each of which includes a one-bit error, and read data R(#3), which includes a multi-bit error.

With respect to the prior art, when read data R(x) having a one-bit error is transferred, a syndrome is computed from period T1 to period T2. Error-corrected read data C(#1) starts being transferred to a host after KES, Chien search and error correction operations are completed, from period T2 to period T3, with reference to the syndrome of read data R(#1). Thus, latency is incurred by delay time ΔT resulting from the KES, Chien search and error correction operations for error correction. Performance of the error correction circuit may be determined by the delay time ΔT taken for the KES, Chien search and error correction operations.

With respect to embodiments of the present invention, a syndrome is computed with respect to transferred data at the same time read data R(#1) starts being transferred from a flash memory device (not shown) from period T1 to period T2. When a one-bit error is detected, controller 160 activates single-bit error correction circuit 120, as described above. The single-bit error correction circuit 120 may perform a division operation of $S_{i+1}/S_i$ using syndrome elements. In this case, because KES and Chien search operations are skipped, which would otherwise require many cycles, latency is reduced to ΔT1. That is, the error correction operation may be performed within five cycles (e.g., five cycles of system clock), for example. The error correction method is likewise applied to read data R(#2), which also includes a one-bit error.

With respect to read data R(#3), which includes a multi-bit error, such as a 3-bit error, KES circuit 131 and Chien search circuit 134 must be activated to perform KES and Chien search operations, respectively. However, it is possible to minimize latency corresponding to the multi-bit error correction operation by using a forward Chien search operation. In other words, a reduced latency of ΔT2 is incurred until error-corrected read data C(#3) starts being transferred after an input of read data R(#3), including the 3-bit error.

Generally, in accordance with the above-described error correction configuration and function of the embodiments, when a one-bit error is generated, KES and Chien search operations are not activated, while an error pattern is determined from a syndrome within several cycles. Thus, it is possible to reduce or minimize latency due to an error correction operation.

Figure 10:
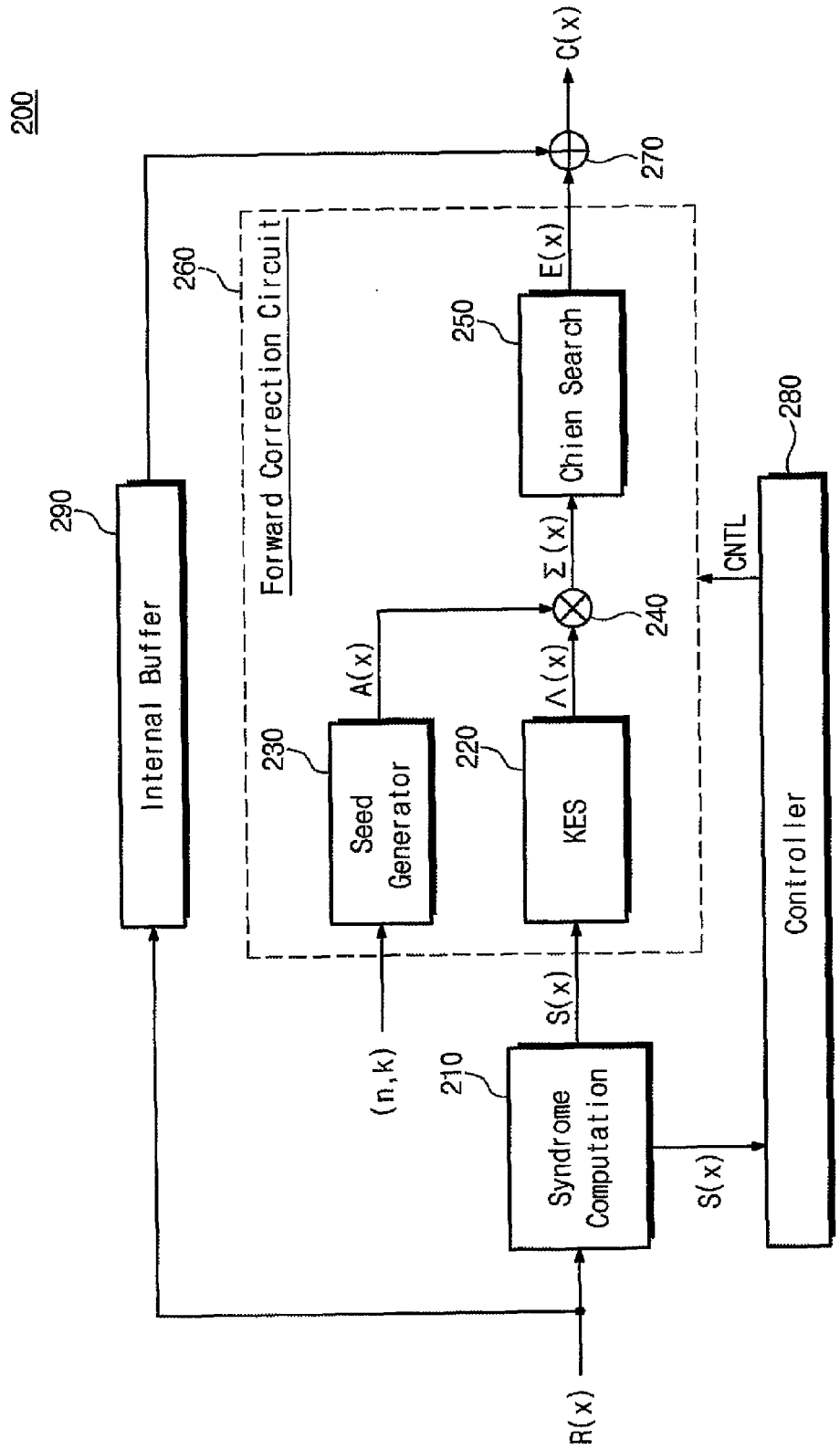
FIG. 10 is a block diagram showing an error correction circuit, according to exemplary embodiments of the present invention.

FIG. 10 is a block diagram showing an error correction circuit, according to another exemplary embodiment of the present invention.

Referring to FIG. 10, an ECC circuit or error correction decoder 200 refers to a syndrome S(x) to use different error correction algorithms according to an error bit number. That is, the error correction decoder 200 may utilize different error correction methods with respect to a one-bit error (or single-bit error) and a multi-bit error (two or more error bits), respectively. According to this error correction scheme, an error of read data R(x) is eliminated at high speed and the error-corrected read data is sent to a host.

Read data R(x) may be stored in an internal buffer 290 during a delay time when error detecting and correcting operations are performed. The internal buffer 290 may store and output the read data R(x) in a FIFO manner, for example. During the buffering operation, a syndrome computation circuit 210 produces syndrome S(x) of the received read data R(x). The syndrome computation circuit 210 may compute the syndrome S(x) indicating error information by multiplying the read data R(x) by a parity detection polynomial H(x), for example. The computed syndrome S(x) is sent to a controller 280 and to a KES circuit 220 of a forward correction circuit 260.

In the depicted embodiment, the forward correction circuit 260 includes the KES circuit 220, a seed generator 230, a Galois-Field multiplier 240 and a Chien search circuit 250. In case of a multi-bit error, the KES circuit 220 and the Chien search circuit 250 of the forward correction circuit 260 perform a KES operation and a forward Chien search operation, respectively. The KES circuit 220 may calculate an error location polynomial and an error pattern polynomial from the syndrome S(x), and output error location polynomial Λ(x). As discussed above with respect to KES circuit 131, when decoding in an RS manner, for example, the KES circuit 220 may be realized using EA, ME and BM algorithms. In case of a one-bit error, the KES circuit 220 is inactivated and thus the KES operation is skipped, while roots of error location and error pattern polynomials are calculated via an activated forward Chien search operation by the Chien search circuit 250.

The seed generator 230 may be configured to previously provide a seed value for the forward Chien search operation, while the Chien search circuit 250 computes roots of the error location and error pattern polynomials. For the forward Chien search operation, the seed generator 230 may provide an initial seed value corresponding to a code word, for example, including length information (n, k) of the read data R(x).

The Galois-Field multiplier 240 generates a new error location polynomial Σ(x) by multiplying the error location polynomial Λ(x) from the KES circuit 220 and the seed value A(x) from the seed generator 230.

The Chien search circuit 250 may execute the forward Chien search operation with reference to the error location polynomial Σ(x) generated using the seed value A(x). At this time, it is possible to output an error correction vector E(x) generated according to the forward Chien search operation simultaneously with performing the Chien search operation. Thus, as compared to a backward Chien search operation, in which the Chien search operation must be completed before outputting error correction, the latency resulting from performance of only the forward Chien search operation is reduced. When the Chien search circuit 250 calculates an error location of read data R(x) according to the forward Chien search operation, the result may be output as an error correction vector E(x) for correcting the error. The Chien search circuit 250 may be activated regardless of whether an error indicated by the syndrome S(x) is a single-bit error or a multi-bit error.

An error correction circuit 270 corrects the error of read data R(x) received from the internal buffer 290 using the error correction vector E(x). The controller 280 initially judges whether an error of the read data R(x) is a single-bit error or a multi-bit error, based on the syndrome S(x). The controller 280 also determines whether the KES circuit 220 is activated based on the judgment result.

Generally, in the above-described embodiments, when a single-bit error is detected, latency caused by a KES operation is reduced without additionally configuring constituent elements for correcting the single-bit error.

Figure 11:
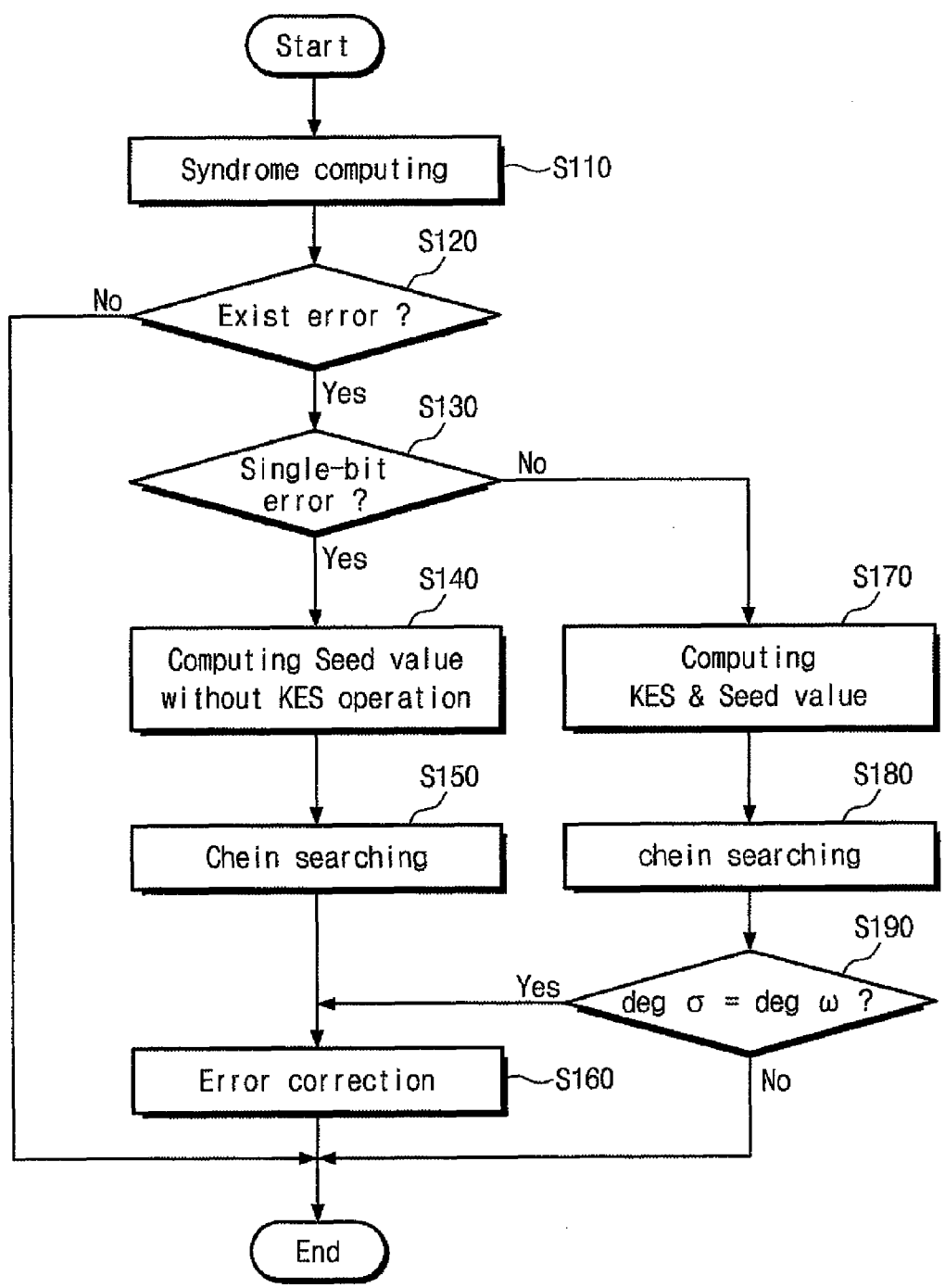
FIG. 11 is a flow chart showing an operation of an error correction, according to exemplary embodiments of the present invention.

FIG. 11 is a flow chart showing a representative error correction operation of the error correction decoder 200, according to an exemplary embodiment of the present invention. Referring to FIG. 11, KES and Chien search operations are performed in case of a multi-bit error (two or more error bits) and the KES operation is skipped in case of a single-bit error. Below, the representative error correction method will be more fully described with reference to FIG. 10.

When read data R(x) is transferred, operations for detecting and correcting errors commence. In step S110, syndrome S(x) for the read data R(x) is computed by syndrome computation circuit 210 at the same time the read data R(x) starts being received by the error correction decoder 200. In step S120, controller 280 determines whether the read data R(x) is erroneous, based on the syndrome S(x) generated by the syndrome computation circuit 210. For example, when syndrome element values of the syndrome S(x) are 0, no error exists. Other syndrome element values of S(x) may indicate that the read data R(x) includes errors. When no error exists, the procedure ends. On the other hand, when a syndrome element value of the syndrome S(x) is not a zero, the process proceeds to step S130 to determine whether the error of the read data R(x) is a single-bit error or a multi-bit error, according to the syndrome S(x). For example, the controller 280 may check whether the syndrome elements of the syndrome S(x) satisfy the condition of Equation 1, indicating a single-bit error. When the syndrome S(x) indicates that there is a single-bit error, the process proceeds to steps S140 through S150 for performing a forward Chien search operation without a KES operation. When the syndrome S(x) indicates that two or more error bits exist, the process proceeds to steps S170 trough S190, in which error location and error pattern are obtained by KES and Chien search operations.

More particularly, when the syndrome S(x) indicates that the read data R(x) has a one-bit error, seed generator 290 calculates a seed value A(x) in step S140 for supporting the forward Chien search operation. The seed value A(x) may be selected according to length information (n, k) of a code, for example. In step S140, computation of error location and error pattern polynomials via the KES operation are skipped. When the seed value A(x) is provided, the Chien search circuit 250 executes the forward Chien search operation in step S150. In next step S160, the single-bit error of the read data R(x) is corrected using an error pattern provided by the forward Chien search operation.

When the syndrome S(x) indicates that the read data R(x) has a multi-bit error, an error correction operation commences using a forward Chien search scheme. In step S170, the KES circuit 220 performs a KES operation to seek error location and error pattern polynomials, and the seed generator 230 selects or calculates a seed value A(x), for example, based on code length information (n, k). With reference to the seed value and the error location and error pattern polynomials, in step S180, the Chien search circuit 250 performs the forward Chien search operation in a pipeline manner simultaneously with the Chien search operation. In step S190, degree a of the error location polynomial is compared with degree ω of the error pattern polynomial to determine whether an error is correctable by means of the calculated error pattern. When the degree a of the error location polynomial is identical to the degree ω of the error pattern polynomial, the error is judged to be correctable. The error correction circuit may then provide an error correction vector E(x) in step S160 to correct the error. When the degree a of the error location polynomial is not identical to the degree ω of the error pattern polynomial, the error is uncorrectable. In this case, the procedure ends.

Generally, in the above-described embodiments, in case of a single-bit error, the KES circuit is inactivated and only the forward Chien search operation is performed. On the other hand, in case of a multi-bit error, the KES circuit is activated, so that error location and error pattern polynomials are obtained and a forward Chien search is performed to simultaneously correct the error. Thus, the above-described embodiments are able to support a fast error correction function.

Figure 12:
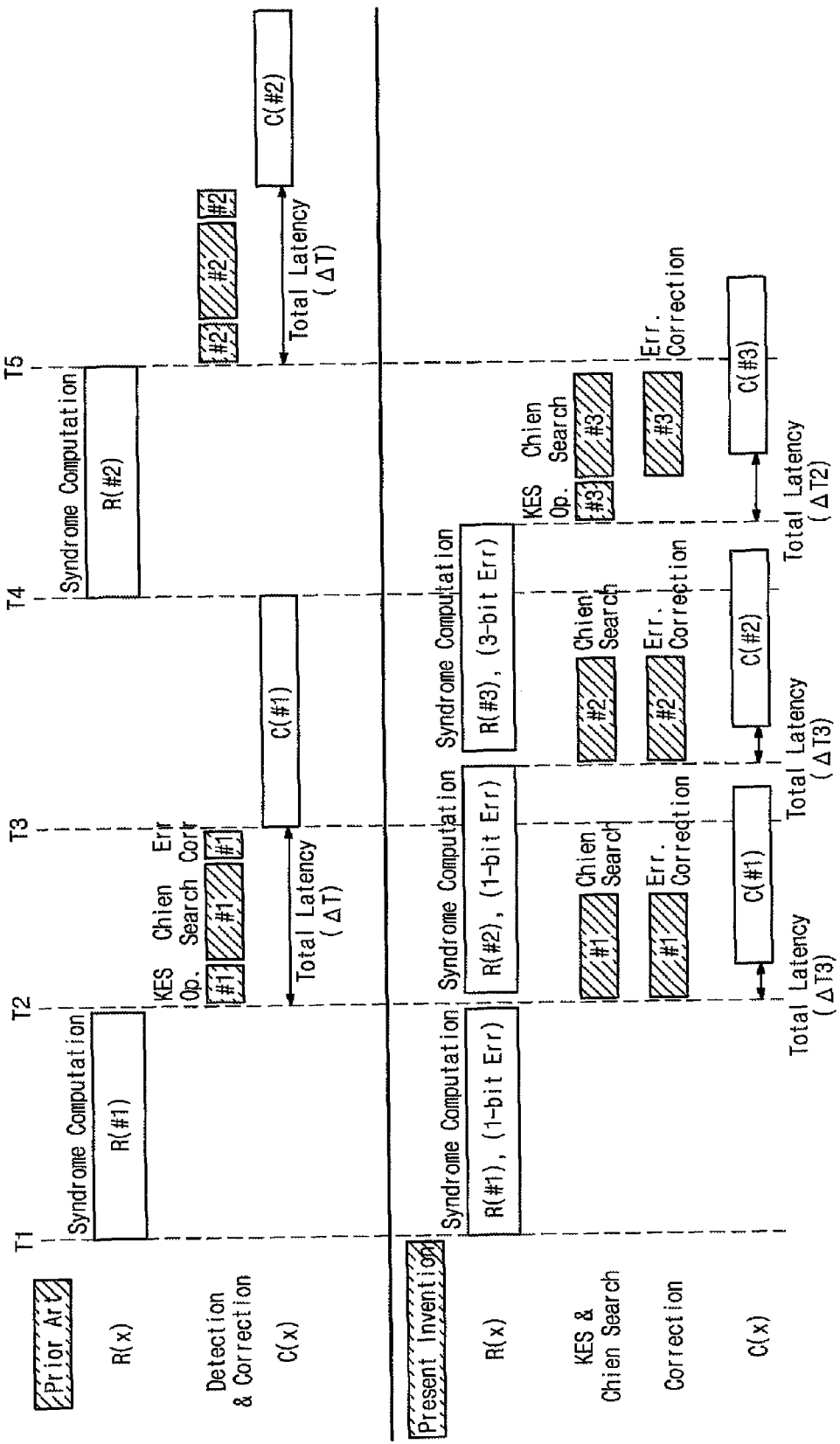
FIG. 12 is a timing diagram showing an operation of an error correction circuit, according to exemplary embodiments of the present invention.

FIG. 12 is a timing diagram showing an error correction operation, according to exemplary embodiments of the present invention. FIG. 12 shows timing of a prior art error correction operation and timing of an error correction operation according to embodiments of the present invention, in which a KES operation is skipped in case of a one-bit error and the one-bit error is corrected via a forward Chien search operation. For purposes of description, it is assumed that read data R(#1, #2) having a one-bit error and read data R(#3) having a multi-bit error are input sequentially.

With respect to the prior art, when read data R(#1) having a one-bit error is transferred, a syndrome is calculated from period T1 to period T2. Error-corrected read data C(#1) starts being transferred to a host after KES, Chien search and error correction operations are completed, from period T2 to period T3, with reference to the syndrome of read data R(#1). Thus, latency is incurred by delay time ΔT resulting from the KES, Chien search and error correction operations. Performance of the error correction circuit may be determined by the delay time ΔT taken for the KES, Chien search and error correction operations.

In accordance with embodiments of the present invention, it is assumed that the read data R(#1, #2) has a one-bit error and read data R(#3) has continuous three error bits. First, read data R(#1) starts being transferred from a flash memory device (not shown) from period T1 to period T2, and simultaneously a syndrome is sequentially calculated with respect to the transferred data. When a one-bit error is detected, controller 280 inactivates KES circuit 220 and performs a forward Chien search operation according to a seed value A(x). Thus, a delay time resulting from the KES operation is eliminated when correcting a one-bit error, resulting in a relatively short latency ΔT3. The error correction method is likewise applied to read data R(#2), which also includes a one-bit error.

However, since the read data R(#3) includes a multi-bit error, such as a 3-bit error, both the KES and forward Chien search operations must be performed. However, it is possible to minimize latency corresponding to the error correction operation by using the forward Chien search operation. In other words, a reduced latency of ΔT2 is incurred until error-corrected read data C(#3) starts being transferred after an input of read data R(#3), including the 3-bit error.

Generally, in accordance with the above-described error correction function of the embodiments, when a one-bit error is generated, a KES operation is not activated, and an error pattern is determined only by means of a forward Chien search operation. Thus, it is possible to reduce or minimize latency without adding constituent elements for correcting a one-bit error.

Figure 13:
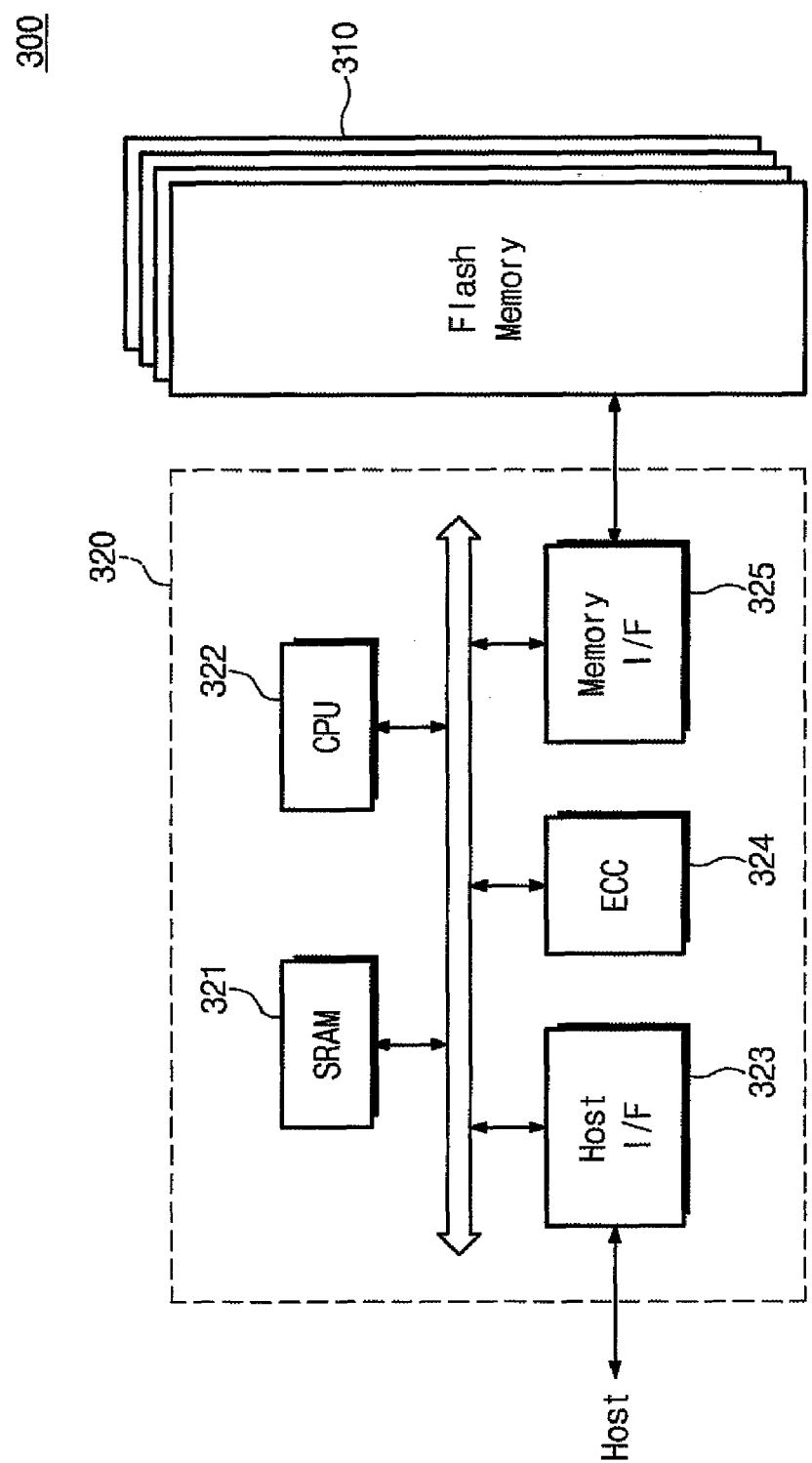
FIG. 13 is a block diagram showing a memory system, according to exemplary embodiments of the present invention.

FIG. 13 is a block diagram showing a memory system, according to exemplary embodiments of the present invention. A memory system 300 may be configured with a memory card or a solid state disk (SSD), for example. Referring to FIG. 13, the memory system 300 supports a high capacity data storing capability and includes a memory controller 320 having an ECC circuit or error correction decoder 324, according to embodiments of the present invention, and a non-volatile memory device 310, such as a flash memory. Data read from the non-volatile memory device 310 may be sent to a host after an error correction operation of the ECC circuit 324 with respect to the read data.

Static random-access memory (SRAM) 321 is used as an operating memory of a central processing unit (CPU) 322. A host interface 323 has a data exchange protocol of the host connected to the memory system 300. The ECC circuit 324 detects and corrects an error of the data read from the non-volatile memory device 310. The ECC circuit 324 may have the same configuration and function as error correction decoder 100 or 200, illustrated in FIG. 2 or FIG. 10, respectively. A memory interface 325 interfaces with the non-volatile memory device 310. The CPU 322 performs all control operations for data exchange of the memory controller 320. Although not illustrated, the memory system according to embodiments of the present invention may further include ROM that stores code data for interfacing with the host.

Further, as stated above, the non-volatile memory device 310 may be a flash memory device, for example. Also, the non-volatile memory device 310 may be formed of resistive memories such as Phase change Random Access Memory (RRAM), Resistance RAM (RRAM), and the like. Further, the non-volatile memory device 310 may be embodied by one of Nano Floating Gate Memory (NFGM), Polymer Random Access Memory (PoRAM), Ferroelectric Random Access Memory (FRAM), and the like. The non-volatile memory device 310 may be formed of a single chip where a chip is included in one package, or a multi-chip package (MCP) where multiple non-volatile memory devices are included in one package.

As stated above, the above-described memory system 300 may be configured as an SSD. In this case, it is easy to realize the SSD of a high density. Although not illustrated, the memory system 300 may be used as a storage device for an information processing apparatus in combination with an application chipset, a camera image processor (CIS), mobile DRAM, and the like, for example. Also, the memory system 300 may be selected from a group including Multimedia Card (MMC), Secure Digital (SD) card, micro SD card, memory stick, ID card, PCMCIA card, chip card, USB card, smart card, Compact Flash (CF) card, and the like.

Further, the memory system 300 according to embodiments of the present invention may be packaged according to various types of packaging. For example, the memory system 300 may be packaged according to one selected from a group including Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 14:
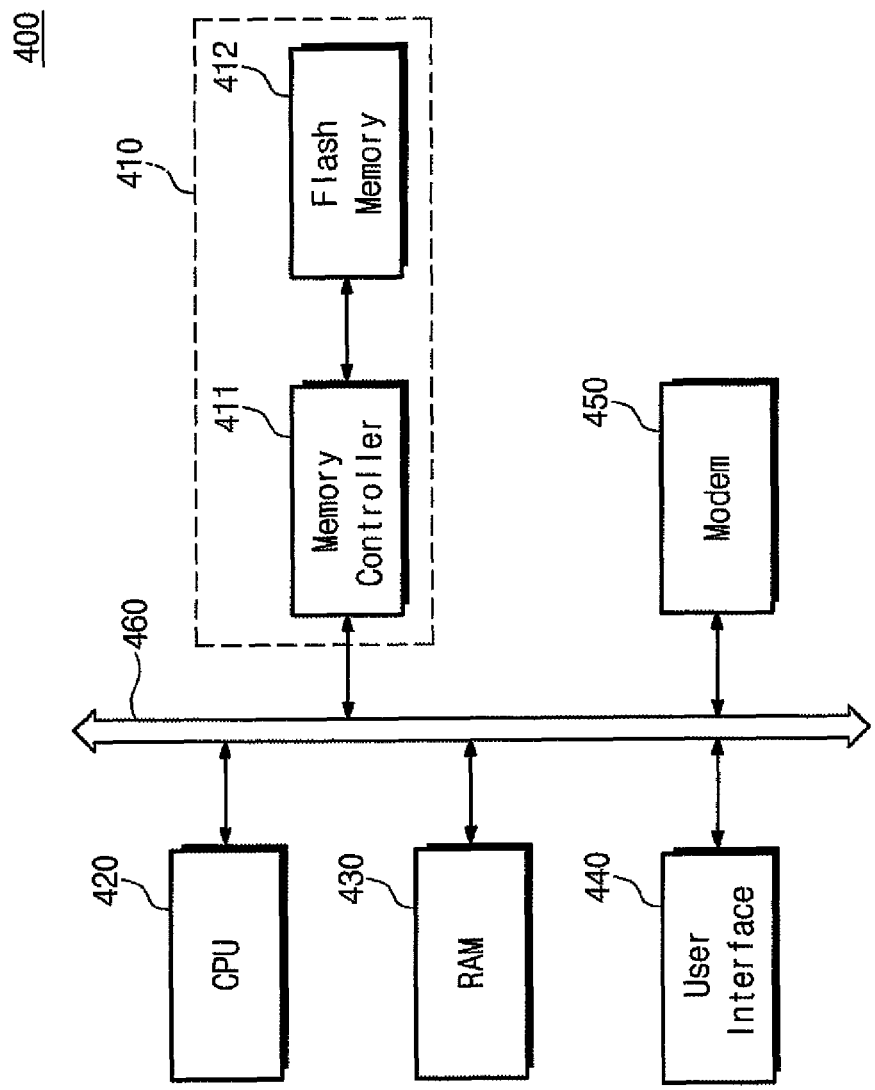
FIG. 14 is a block diagram showing a computing system, according to exemplary embodiments of the present invention.

FIG. 14 is a schematic circuit diagram showing a computing system, according to exemplary embodiments of the present invention. Referring to FIG. 14, a memory system 410 may be installed in information processing systems, such as mobile devices, desk top computers, and the like. A computing system 400 may include a memory system 410 formed of a memory controller 411 and a non-volatile memory device 412, CPU 420, RAM 430, user interface 440, and modem 450, which are connected to a bus 460. The memory system 410 may be configured substantially the same as the memory system or memory card described above with respect to FIG. 13. The non-volatile memory device 412 stores data provided via the user interface 440 or data processed by the CPU 420, under the control of the memory controller 411. Both the CPU 420 of a host including the memory system 410 and other elements may be provided with high-reliability data from the memory system 410. For example, the computing system 400 may be installed in a desk top computer, a notebook computer, a mobile device, such as a cellular phone, and the like, to be used as data storage. Although not illustrated, it would be apparent to one of ordinary skill in the art that the computing system 400 may further include an application chipset, camera image processor (CIS), and the like.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An error correction decoder comprising:
   a syndrome computation circuit for calculating a syndrome of read data;
   an error correction and computation circuit for calculating a location of a single-bit error using a division operation between elements of the syndrome when the single-bit error exists in the read data; and
   an error correction circuit for correcting the single-bit error of the read data based on the location of the single-bit error.

2. The error correction decoder of claim 1, wherein the error correction and computation circuit comprises:
   a single-bit error correction circuit for performing the division operation between the elements of the syndrome to compute the location of the single-bit error; and
   a multi-bit error correction circuit for performing a forward Chien search operation to compute error location and pattern from the syndrome.

3. The error correction decoder of claim 2, further comprising:
   a controller for detecting from the syndrome whether to activate the single-bit error correction circuit.

4. The error correction decoder of claim 2, wherein the single-bit error correction circuit comprises:
   an inverse Galois-Field module for providing a reciprocal $(1/S_i)$ of a first element $(S_i)$ of the syndrome; and
   a Galois-Field multiplier for performing Galois-Field multiplication of the reciprocal $(1/S_i)$ and a second element $(S_{i+1})$ of the syndrome to output a result as an error location function $(S_{i+1}/S_i)$.

5. The error correction decoder of claim 4, wherein the single-bit error correction circuit further comprises:
   a converter for converting the error location function $(S_{i+1}/S_i)$ into a format of error correction data for correcting the error of the read data.

6. The error correction decoder of claim 5, wherein the error correction data comprises error location and error pattern values.

7. The error correction decoder of claim 4, wherein the inverse Galois-Field module comprises a table stored in a read-only memory (ROM) having a plurality of reciprocals corresponding to a plurality of elements of the syndrome, the ROM table being driven in a look-up table manner where the reciprocal $(1/S_i)$ is provided in response to the first element $(S_i)$.

8. The error correction decoder of claim 4, wherein the inverse Galois-Field module comprises a software module configured to compute the reciprocal $(1/S_i)$ of the first element $(S_i)$.

9. The error correction decoder of claim 2, wherein the single-bit error correction circuit comprises:
   a divider for performing a Galois-Field division operation using a first element $(S_i)$ of the syndrome as a divisor and a second element $(S_{i+1})$ of the syndrome as a dividend; and
   a converter for converting an output of the divider as an error location function $(S_{i+1}/S_i)$ into a format of error correction data for correcting the error of the read data.

10. The error correction decoder of claim 2, wherein the multi-bit error correction circuit comprises:
    a key equation solver (KES) circuit for generating an error location polynomial and an error pattern polynomial from the syndrome;
    a seed generator for generating a seed value for a Chien search operation with reference to code length information (n, k) of the read data; and
    a Chien search circuit for computing zeros of the error location polynomial and the error pattern polynomial with reference to the seed value.

11. The error correction decoder of claim 1, further comprising:
    a buffer for storing the read data to provide the read data to the error correction circuit.

12. The error correction decoder of claim 1, wherein the read data includes an error correction code of a circuit code manner.

13. The error correction decoder of claim 1, wherein the read data comprises an error correction code of a Bose Chaudhuri Hocquenghem (BCH) or a Read-Solomon (RS) code type.

14. A method of correcting an error of circuit code data comprising:
    computing a syndrome of read data;
    determining when the read data includes an error and whether the error of the read data is a one-bit error, based on the syndrome;
    when the error of the read data is a one-bit error, obtaining an error location using a division operation of consecutive elements of the syndrome; and
    correcting the error of the read data based upon the error location.

15. The method of claim 14, wherein the division operation comprises obtaining a reciprocal ($1/S_i$) of a first element ($S_i$) of the syndrome; and multiplying the reciprocal and a second element ($S_{i+1}$) of the syndrome.

16. The method of claim 15, wherein the reciprocal ($1/S_i$) is obtained from a table.

17. The method of claim 15, wherein the reciprocal ($1/S_i$) is obtained via a reciprocal computation algorithm provided by a Galois-Field.

18. The method of claim 14, further comprising:
    performing a forward Chien search operation for computing an error location from the syndrome when the error is a multi-bit error.

19. The method of claim 18, further comprising:
    computing a seed value used to perform the forward Chien search operation.

20. A memory system comprising:
    a non-volatile memory device; and
    a memory controller comprising an error correction code (ECC) circuit for eliminating an error from read data of the non-volatile memory device, wherein the ECC circuit comprises:
        a syndrome computation circuit for computing a syndrome from the read data;
        an error correction and computation circuit for computing a location of the error of the read data using a division operation between elements of the syndrome, when the error is a single-bit error; and
        an error correction circuit for correcting the error of the read data with reference to the error location.

* * * * *